United States Patent [19]

Bobbio

[11] Patent Number: 5,001,594
[45] Date of Patent: Mar. 19, 1991

[54] ELECTROSTATIC HANDLING DEVICE

[75] Inventor: Stephen M. Bobbio, Wake Forest, N.C.

[73] Assignee: MCNC, Research Triangle Park, N.C.

[21] Appl. No.: 403,755

[22] Filed: Sep. 6, 1989

[51] Int. Cl.$^5$ ............................................. H01H 1/06
[52] U.S. Cl. ..................................... 361/234; 361/230
[58] Field of Search ...................... 361/230, 233, 234; 269/8, 289 R, 903

[56] References Cited

U.S. PATENT DOCUMENTS

| | | | |
|---|---|---|---|
| 3,571,678 | 3/1971 | Sezako et al. | 361/234 |
| 3,634,740 | 1/1972 | Stevko | 361/234 |
| 3,916,270 | 10/1975 | Wachtler et al. | 361/234 |
| 3,966,199 | 6/1976 | Silverberg | 355/217 |
| 3,976,370 | 8/1976 | Goel et al. | 355/315 |
| 4,184,188 | 1/1980 | Briglia | 361/234 |
| 4,257,083 | 3/1981 | Blyth | 361/234 |
| 4,384,918 | 5/1983 | Abe | 361/234 |
| 4,480,284 | 10/1984 | Tojo et al. | 361/234 |
| 4,502,094 | 2/1985 | Lewin et al. | 361/234 |
| 4,520,421 | 5/1985 | Sakitani et al. | 361/234 |
| 4,554,611 | 11/1985 | Lewin | 361/234 |
| 4,624,302 | 11/1986 | Hayden et al. | 361/234 |
| 4,645,218 | 2/1987 | Ooshio et al. | 361/234 |
| 4,665,463 | 5/1987 | Ward et al. | 361/234 |
| 4,672,503 | 6/1987 | Masuda et al. | 361/230 |
| 4,692,836 | 9/1987 | Suzuki | 361/234 |
| 4,724,510 | 2/1988 | Wicker et al. | 361/234 |
| 4,733,632 | 3/1988 | Ohmi et al. | 361/234 |
| 4,751,609 | 6/1988 | Kasahara | 361/234 |

Primary Examiner—A. D. Pellinen
Assistant Examiner—Jeffrey A. Gaffin
Attorney, Agent, or Firm—Bell, Seltzer, Park & Gibson

[57] ABSTRACT

An electrostatic handling device for a wafer having a pair of faces, includes a dielectric region having a top face which is adapted to accept one of the pair of wafer faces thereagainst. Conductors are positioned in the dielectric region. The conductors are arranged in the dielectric region to generate electrostatic force between the conductors and the wafer to hold the wafer against the top face of the dielectric region. The conductors are further arranged in the dielectric region to generate substantially no net electrostatic force at the opposite one of the pair of wafer faces to thereby reduce electrostatic force interference thereat.

21 Claims, 1 Drawing Sheet

ELECTROSTATIC HANDLING DEVICE

FIELD OF THE INVENTION

This invention relates generally to an electrostatic handling device and more particularly to an electrostatic handling device for wafers, typically semiconductor wafers, upon which microelectronic devices are fabricated.

BACKGROUND OF THE INVENTION

In the conventional arrangement, electrostatic handling devices for wafers comprise a layer of dielectric material for carrying a wafer to be processed and conductor lines or wires which pass through the dielectric material. When a voltage is applied to the conductor lines, an electrostatic force (i.e. an electric field creating a coulombic force) is produced which polarizes, at least temporarily, both the wafer and the dielectric material. This causes the wafer and dielectric material to be attracted to one another by electrostatic force. Prior art electrostatic handling devices typically employ two groups of interdigitated conductors having uniform spacing between adjacent conductors, with the groups of interdigitated conductors being connected between one or more voltage sources. The interdigitated conductors may be formed as interdigitated straight parallel lines, as illustrated in U.S. Pat. No. 4,184,188 to Briglia, or as interdigitated concentric rings, as illustrated in U.S. Pat. No. 4,724,510 to Wicker, et al. Other arrangements may also be employed.

Unfortunately, the electric field generated with the prior art electrostatic handling devices is quite large (e.g. greater than 5kV) and extends into the region at or above the wafer face to be processed. This electric field may degrade a number of wafer processing operations and simply cannot be tolerated in other operations. For example, reactive ion etching, plasma etching, sputtering, and ion implantation cannot properly take place in the presence of such a large strength electric field near the wafer. For these operations, the prior art often had to employ mechanical or vacuum handling devices which are complicated and introduce a new set of problems.

One attempt to reduce the electric field generated with the prior art electrostatic handling devices has employed a polarizable dielectric for the layer of dielectric material. The polarizable dielectric material retains charge even after the voltage is received from the conductive lines, so that the voltage on the conductive lines need not be maintained. Unfortunately, the use of a polarizable dielectric material makes it difficult to remove the wafer from the handling device after processing is complete because the retained charge in the dielectric material continues to attract the wafer. The fragile wafers often break during removal, or portions of the dielectric material separate from the electrostatic handling device, thereby rendering the wafer and device unusable.

SUMMARY OF THE INVENTION

With the foregoing in mind, it is a primary object of the present invention to provide an electrostatic handling device which allows processing of a wafer without interference from the electrostatic forces that are holding the wafer stationary.

It is a further object of the present invention to provide an electrostatic handling device which does not require the use of polarizable dielectric material to retain charge.

These and other objects and advantages of the present invention are achieved by an electrostatic handling device in which the spacing between the conductors and the spacing between the conductors and the top surface of the dielectric region are correlated with the wafer thickness to generate an electrostatic force between the device and the wafer yet generate substantially no electrostatic force at the top surface of the wafer which contains the active processing region. In particular, the handling device includes a dielectric region having a top face which is adapted to accept one of the pair of wafer faces thereagainst. The conductors are arranged in the dielectric region to generate electrostatic forces between the conductors and the wafer when the conductors are charged, to thereby hold the wafer against the top face of the dielectric region. The conductors are further arranged in the dielectric region to generate substantially no net electrostatic force at the opposite one of the pair of wafer faces when the conductors are charged, to thereby reduce electrostatic force interference thereat.

More specifically, according to the present invention, the conductors are arranged to have a spacing between each other which is less than the spacing between the pair of wafer faces (i.e. less than the wafer thickness) but is greater than the spacing from the conductors to the top of the dielectric region (i.e. the conductor depth). Preferably, the spacing from the conductors to the top face of the dielectric region is substantially less than onethird the spacing between the conductors, and the spacing from the conductors to the top face of the dielectric region plus the spacing between the pair of wafer faces is greater than two-thirds of the spacing between the conductors.

Even though electrostatic handling devices are wellknown and there have been many attempts to improve them, there has been no recognition or suggestion that the long-standing problem of electrostatic interference at the top wafer face may be solved by arranging the conductors in a certain way in the dielectric. In other words, the prior art has not suggested or taught that a geometrical relationship between the conductors, the dielectric, and the wafer may reduce the persistent problem of electrostatic force interference. This reduction brings the net interference down to an acceptable level which does not interfere with wafer processing techniques.

The present invention provides a sufficiently high handling force and substantially no interference at the top wafer surface. A polarizable dielectric need not be employed to retain charge. Accordingly, the dielectric region of the electrostatic handling device of the present invention can be made of a simple insulator such as silicon dioxide, silicon nitride, or polyimide. This allows the dielectric material to be repeatedly used without fixing a permanent polarity in it. Consequently, the wafer may be easily removed without breaking the wafer or the dielectric material.

BRIEF DESCRIPTION OF THE DRAWINGS

Some of the features and advantages of the invention having been stated, others will appear as the description proceeds, when taken in connection with the accompanying drawings, in which.

DETAILED DESCRIPTION OF THE INVENTION

While the present invention will be described hereinafter with particular reference to the accompanying drawings, it is to be understood at the outset of this description that persons skilled in the applicable arts will be able to modify the specific arrangements here described and shown while continuing to achieve the desired result of this invention. Accordingly, the description and illustrations are to be taken as broad, teaching disclosures directed to persons skilled in the appropriate arts, and not as restricting the scope of the present invention.

Figure 1:
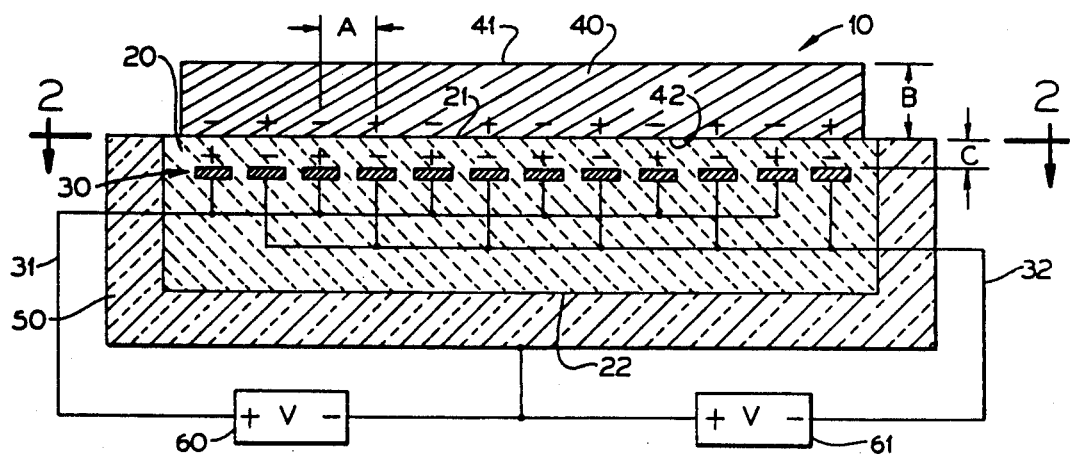
FIG. 1 is a side cross-sectional view looking across the middle of an electrostatic handling device according to the invention.

FIG. 1 illustrates a side cross-sectional view looking across the middle of an electrostatic handling device 10 for wafer processing applications which comprises a dielectric region 20, conductors 30, and support structure 50. Wafer 40, which is to be held by the electrostatic handling device 10, has a pair of wafer faces, i.e. top face 41, and bottom face 42. As is well known to those having skill in the art, microelectronic devices are typically formed in and on top face 41. Dielectric region 20 has a top face 21 and a bottom face 22. The top face 21 is adapted for accepting one of the pair of wafer faces (face 42) thereagainst. The bottom face 22 may rest on or be attached to the support structure 50. According to the invention, dielectric region 20 may be fabricated out of silicon dioxide, silicon nitride, polyimide, or other well known insulators. Polarizable dielectrics need not be employed, although they may be employed.

Conductors 30 are positioned in the dielectric region 20 between faces 21, 22. At least one of the conductors 30 can be charged positively and at least one of the conductors 30 can be charged negatively with respect to one another. According to the invention, conductors 30 are arranged the dielectric region 20 to generate electrostatic forces between the conductors 30 and the wafer 40 to hold the wafer against the top face 21. Conductors 30 are further arranged in the dielectric region 20 according to the invention, to generate substantially no net electrostatic force at the opposite of one of the pair of wafer faces (face 41) to thereby reduce electrostatic force interference thereat in the region where the semiconductor devices are located.

In particular, according to the invention, conductors 30 are arranged to have a spacing A between each other which is less than the spacing B between the pair of wafer faces 41, 42 but is greater than the spacing C from the conductors 30 to the top face 21 of the dielectric region 20.

A preferred embodiment further specifies the geometrical relationship between the spacings A, B, and C with the aid of Maxwell's equations for electric fields. Stated practically, the electric field lines are normal to the plane of a regular array of wires at a distance of approximately one third the wire spacing. Preferably, the spacing C from the conductors 30 to the top face 21 of the dielectric region 20 is substantially less than one third of the spacing A between the conductors 30. In other words:

$$C << (\tfrac{1}{3})A \qquad (1)$$

Also preferably, the spacing C from the conductors 30 to the top face 21 plus the spacing B between the pair of wafer faces 41, 42 is greater than one third of the spacing between similarly charged conductors 30. For example, if the conductors 30 alternate positive and negative, the spacing between similarly charged conductors is two times the spacing A. In other words:

$$C + B > (\tfrac{1}{3})2A = (\tfrac{2}{3})A. \qquad (2)$$

Conductors 30 may be arranged in groups for varying the charges to be carried thereon. For example, a suitable arrangement would be to have a first group of conductors 31 adapted to be charged positively and a second group of conductors 32 adapted to be charged negatively. The first group of conductors 31 may be connected to a first voltage source 60 while the second group of conductors 32 may be connected to a second voltage source 61. However, one voltage source, with its positive and negative sides connected to the respective groups 31, 32, may also be employed.

Figure 2:
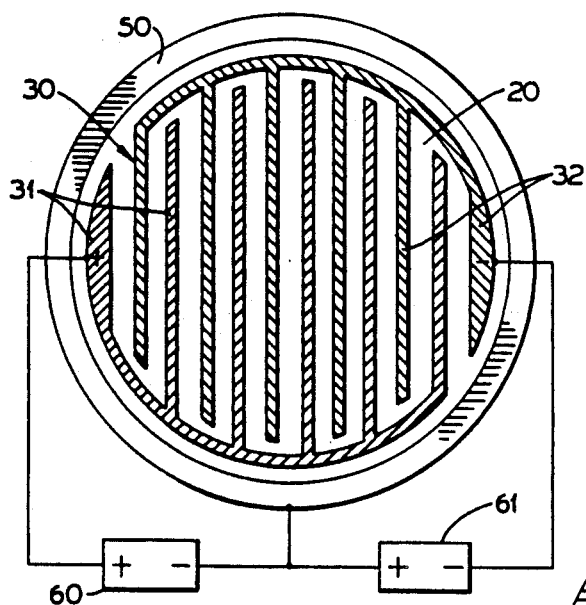
FIG. 2 is a top cross-sectional view thereof looking down substantially from line 2—2 and in a plane parallel to the top face of the dielectric region.
Figure 3:
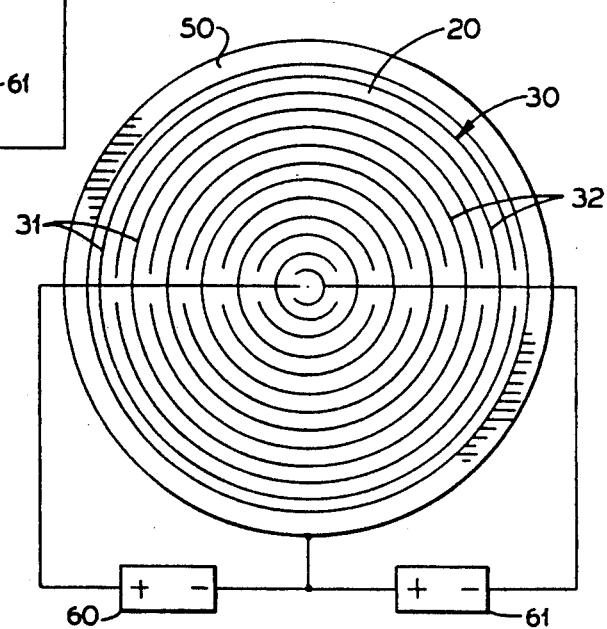
FIG. 3 is a top cross-sectional view of a second embodiment of the invention looking down substantially from line 2—2 and in a plane parallel to the top face of the dielectric region.

The conductors 30 may be interdigitated so that the conductors in the first group 31 are adjacent to the conductors in the second group 32 with a predetermined spacing between adjacent conductors. Further, the conductors 30 may be interdigitated in parallel straight lines (see FIG. 2) or in C-shaped concentric rings (see FIG. 3) which both lie in a plane parallel to the top face 21 of the dielectric region 20. FIGS. 2 and 3 are top cross-sectional views of the dielectric region 20 looking down substantially from line 2—2 and in a plane parallel to the top face 21.

It should be noted that there may be other different ways to group the conductors, charge the conductors, or arrange the conductors, according to the invention, to obtain a sufficient handling force with substantially no electric field at the top face 41 of wafer 40. For example, each conductor 31 and 32 may be formed of a plurality of closely spaced conductors rather than a single conductor. Moreover, an array of "dot" conductors, of circular, rectangular, or polygonal shape may be provided rather than an array of elongated conductors. It will also be understood that voltage sources 60 and 61 need not provide equal and opposite voltages, because the voltage difference between conductors 31 and 32 determines the electric fields produced by electrostatic handling device 10.

In operation, referring again to FIG. 1, when the voltage is applied to the conductors 30, an electrical field is formed for polarizing both the wafer 40 and the dielectric region 20. This polarization causes the wafer 40 and dielectric region 20 to be attracted to one another by electrostatic or coulombic forces. The arrangement of the conductors 30, dielectric region 20, and wafer 40 causes there to be large enough electrostatic forces to hold the wafer 40 to the dielectric region 20 while it also causes there to be substantially no net electrostatic force near the face of the wafer 40 to be processed, thereby reducing the electrostatic force interference thereat. In other words, the electrostatic forces essentially neutralize one another near the face of the wafer 40 to be processed to avoid interference with sensitive wafer processing techniques and applications, such as reactive ion etching.

EXAMPLES

In one example, wafer thickness B was assumed to be 20 mils. Spacing A was set at 30 mils. If the breakdown strength of the dielectric is $10^6 V/cm = 2.5 kV/mil$, the minimum distance C for a 5kV applied voltage is 2 mil. This value of C is consistent with equation (1). Substantially no electric field was observed at the wafer surface, and a sufficient holddown force was observed.

In another example, a spacing A of 0.016 inch was used with a voltage difference of about 300V. About 4000Å of thermally grown silicon dioxide provided dimension C. Wafer thickness B was 0.023 in. A holddown force of about $1/9$ lb./in$^2$ was obtained, with little residual electric field at top wafer surface.

In the drawings and specification, there have been set forth preferred embodiments of the invention, and although specific terms are employed, they are used in a generic and descriptive sense only and not for purposes of limitation, with the scope of the invention being set forth in the following claims:

That which is claimed is:

1. An electrostatic handling device for a wafer having a pair of wafer faces, comprising:
    a dielectric region having a top face, said top face being adapted for accepting one of the pair of wafer faces thereagainst; and
    a plurality of conductors in said dielectric region, at least one of the spacings between said plurality of conductors and the spacing from said plurality of conductors to said top face of said dielectric region being arranged to generate electrostatic force between said conductors and the wafer to thereby hold the wafer against said top face when said conductors are electrically charged, at least one of the spacings between said plurality of conductors and the spacing from said plurality of conductors to said top face of said dielectric region being arranged to generate substantially no net electrostatic force at the opposite one of the pair of wafer faces to thereby reduce electrostatic force interference thereat when said conductors are electrically charged.

2. The electrostatic handling device according to claim 1 wherein said plurality of conductors are arranged to have a spacing between each other which is less than the spacing between the pair of wafer faces.

3. The electrostatic handling device according to claim 1 wherein said plurality of conductors are arranged to have a spacing between each other which is greater than the spacing from said plurality of conductors to said top face of said dielectric region.

4. The electrostatic handling device according to claim 1 wherein the spacing from said plurality of conductors to said top face of said dielectric region is substantially less than one third of said spacing between said conductors.

5. The electrostatic handling device of claim 1 wherein the spacing from said plurality of conductors to said top face of said dielectric region plus the spacing between the pair of wafer faces is greater than two thirds of said spacing between said conductors.

6. The electrostatic handling device according to claim 2 wherein said plurality of conductors are arranged to have a spacing between each other which is greater than the spacing from said plurality of conductors to said top face of said dielectric region.

7. The electrostatic handling device according to claim 2 wherein the spacing from said plurality of conductors to said top face of said dielectric region is substantially less than one third of said spacing between said conductors.

8. The electrostatic handling device according to claim 2 wherein the spacing from said plurality of conductors to said top face of said dielectric region plus the spacing between the pair of wafer faces is greater than two thirds of said spacing between said conductors.

9. The electrostatic handling device according to claim 6 wherein the spacing from said plurality of conductors to said top face of said dielectric region plus the spacing between the pair of wafer faces is greater than two thirds of said spacing between said conductors.

10. The electrostatic handling device according to claim 7 wherein the spacing from said plurality of conductors to said top face of said dielectric region plus the spacing between the pair of wafer faces is greater than two thirds of said spacing between said conductors.

11. The electrostatic handling device according to claim 3 wherein the spacing from said plurality of conductors to said top face of said dielectric region plus the spacing between the pair of wafer faces is greater than two thirds of said spacing between said conductors.

12. The electrostatic handling device according to claim 4 wherein the spacing from said plurality of conductors to said top face of said dielectric region plus the spacing between the pair of wafer faces is greater than two thirds of said spacing between said conductors.

13. The electrostatic handling device according to claim 1 wherein said dielectric region has a bottom face, said electrostatic handling device further comprising a support structure having a top face positioned against said bottom face of said dielectric region.

14. The electrostatic handling device according to claim 1 wherein said plurality of conductors comprise a first group of conductors adapted to be charged positively and a second group of conductors adapted to be charged negatively.

15. The electrostatic handling device according to claim 14 wherein said first group of conductors is connected to a first voltage source and said second group of conductors is connected to a second voltage source.

16. The electrostatic handling device according to claim 14 wherein said conductors in said first and second groups are interdigitated, with a predetermined spacing between adjacent conductors.

17. The electrostatic handling device according to claim 16 wherein said conductors in said first and second groups are interdigitated in C-shaped concentric rings which lie in a plane parallel to said top face of said dielectric region.

18. The electrostatic handling device according to claim 16 wherein said conductors in said first and second groups are interdigitated in parallel lines which lie in a plane parallel to said top face of said dielectric region.

19. The electrostatic handling device according to claim 1 wherein said dielectric region is formed of a material selected from the group consisting of silicon dioxide, silicon nitride, and polyimide.

20. A method for holding the bottom face of a wafer against a dielectric surface comprising the step of: generating electrostatic force between the wafer and the dielectric surface which produce substantially no net electrostatic force at the top face of the wafer, whereby the top face of the wafer may be processed without electrostatic force interference.

21. The method according to claim 20 wherein said dielectric surface is formed of a material selected from the group consisting of silicon dioxide, silicon nitride, and polyimide.

* * * * *

UNITED STATES PATENT AND TRADEMARK OFFICE
CERTIFICATE OF CORRECTION

PATENT NO. : 5,001,594
DATED : March 19, 1991
INVENTOR(S) : Bobbio

It is certified that error appears in the above-identified patent and that said Letters Patent is hereby corrected as shown below:

On the title page:

Under References Cited, please insert the FOREIGN PATENT DOCUMENTS

| | | |
|---|---|---|
| 54-163774 | 12/1979 | Japan |
| 56-81052 | 05/1981 | Japan |
| 1203678 | 01/1986 | USSR |

Column 2, line 33, please delete "onethird" and substitute --one-third-- therefor.

Signed and Sealed this

Eighth Day of September, 1992

Attest:

DOUGLAS B. COMER

Attesting Officer

Acting Commissioner of Patents and Trademarks